US011431903B2

(12) United States Patent
Yang

(10) Patent No.: US 11,431,903 B2
(45) Date of Patent: Aug. 30, 2022

(54) PHOTOSENSITIVE CHIP, MOBILE TERMINAL AND PHOTOGRAPHING METHOD

(71) Applicant: VIVO MOBILE COMMUNICATION CO., LTD., Guangdong (CN)

(72) Inventor: Shangming Yang, Chang'an Dongguan (CN)

(73) Assignee: VIVO MOBILE COMMUNICATION CO., LTD., Chang'an Dongguan (CN)

( * ) Notice: Subject to any disclaimer, the term of this patent is extended or adjusted under 35 U.S.C. 154(b) by 215 days.

(21) Appl. No.: 16/757,748

(22) PCT Filed: Oct. 19, 2018

(86) PCT No.: PCT/CN2018/111022
§ 371 (c)(1),
(2) Date: Apr. 20, 2020

(87) PCT Pub. No.: WO2019/076374
PCT Pub. Date: Apr. 25, 2019

(65) Prior Publication Data
US 2021/0136287 A1 May 6, 2021

(30) Foreign Application Priority Data

Oct. 20, 2017 (CN) .......................... 201710985109.9

(51) Int. Cl.
*H04N 5/232* (2006.01)
*H01L 27/146* (2006.01)
*H04N 5/225* (2006.01)

(52) U.S. Cl.
CPC ... *H04N 5/23245* (2013.01); *H01L 27/14607* (2013.01); *H04N 5/2252* (2013.01)

(58) Field of Classification Search
CPC ............. H04N 5/23245; H04N 5/2252; H04N 5/2257; H04N 5/3696; H01L 27/14607
See application file for complete search history.

(56) References Cited

U.S. PATENT DOCUMENTS

| 2013/0187027 A1 | 7/2013 | Qiao et al. |
| 2014/0211054 A1 | 7/2014 | Kim |
| 2014/0320715 A1 | 10/2014 | Haji-Khamneh et al. |
| 2015/0264278 A1 | 9/2015 | Kleekajai et al. |
| 2020/0045214 A1 | 2/2020 | Zhou et al. |

FOREIGN PATENT DOCUMENTS

| CN | 103973945 A | 8/2014 |
| CN | 104159020 A | 11/2014 |
| CN | 105120160 A | 12/2015 |

(Continued)

OTHER PUBLICATIONS

CN Office Action in Application No. 201710985109.9 dated Feb. 19, 2019.

(Continued)

*Primary Examiner* — Timothy J Henn
(74) *Attorney, Agent, or Firm* — Maschoff Brennan

(57) ABSTRACT

A photosensitive chip, a mobile terminal and a photographing method are provided. The photosensitive chip includes an image sensing portion and ambient light sensing portions, the image sensing portion and the ambient light sensing portions are spliced to form a preset pattern, and the preset pattern is of a quadrangular structure.

16 Claims, 3 Drawing Sheets

(56) References Cited

FOREIGN PATENT DOCUMENTS

| | | |
|---|---|---|
| CN | 107249109 A | 10/2017 |
| CN | 107580167 A | 1/2018 |
| EP | 2 472 853 A1 | 7/2012 |
| TW | 524763 B | 3/2003 |
| TW | 201108732 A | 3/2011 |
| TW | I524763 B | 3/2016 |

OTHER PUBLICATIONS

European Search Report in Application No. 18869394.9 dated Sep. 10, 2020.
International Search Report and Written Opinion in Application No. PCT/CN2018/111022 dated Apr. 30, 2020.

PHOTOSENSITIVE CHIP, MOBILE TERMINAL AND PHOTOGRAPHING METHOD

CROSS-REFERENCE TO RELATED APPLICATIONS

This application is the U.S. national phase of PCT Application No. PCT/CN2018/111022 filed on Oct. 19, 2018, which claims a priority to Chinese Patent Application No. 201710985109.9 filed on Oct. 20, 2017, both disclosures of which are incorporated in their entireties by reference herein.

TECHNICAL FIELD

The present disclosure relates to the field of electronic technologies, in particular to a photosensitive chip, a mobile terminal and a photographing method.

BACKGROUND

In the related technology, an ambient light sensing chip and an image sensing chip are generally provided on a front part of a mobile terminal such as a mobile phone and a tablet computer. The ambient light sensing chip is used to sense ambient light conditions so that the mobile terminal adjusts the display brightness. The image sensing chip is used to camera photograph for imaging.

Since the ambient light sensing chip and the image sensing chip are arranged in parallel in the mobile terminal, when they are stacked on the mobile terminal, the front part of the mobile terminal needs to be provided with at least one light-transmitting hole for transmitting the light, which is not conducive to the appearance effect. Considering that both the chips sense visible light, in some solutions in the related technology, the ambient light sensing chip is integrated into the image sensing chip to solve the above problem. However, in this way, the ambient light sensing chip may occupy a part of the area of the image sensing chip, thereby causing a loss in the number of pixels photographed by the camera and affecting the photographing effect.

SUMMARY

The present disclosure provides a photosensitive chip, a mobile terminal and a photographing method.

In order to solve the above technical problem, the present disclosure is implemented as follows.

In a first aspect, a photosensitive chip is provided according to embodiments of the present disclosure. The photosensitive chip includes an image sensing portion and ambient light sensing portions. The image sensing portion and the ambient light sensing portions are spliced to form a preset pattern, and the preset pattern is of a quadrangular structure.

In a second aspect, a mobile terminal is provided according to embodiments of the present disclosure, which includes the above-mentioned photosensitive chip. The mobile terminal further includes a housing, and the housing is provided with a light-transmitting hole used to transmit incident light to form a light projection area. The photosensitive chip is disposed in the light projection area, and is configured to receive the incident light and perform corresponding photosensitive processing.

In a third aspect, a photographing method is provided according to embodiments of the present disclosure, which is applied to the above-mentioned mobile terminal. The photographing method includes:

monitoring whether an image capturing instruction is received; and obtaining photosensitive data of the image sensing portion to obtain a captured image when the image capturing instruction is received.

In a fourth aspect, a mobile terminal is provided according to embodiments of the present disclosure. The mobile terminal includes:

a monitoring module, configured to monitor whether an image capturing instruction is received; and a processing module, configured to obtain photosensitive data of an image sensing portion to obtain a captured image when the image capturing instruction is received.

In a fifth aspect, a mobile terminal is provided according to embodiments of the present disclosure, which includes a processor, a memory, and a computer program that is stored on the memory and executable on the processor. The processor is configured to execute the computer program to implement steps of the above-mentioned photographing method.

In a sixth aspect, a computer-readable storage medium is provided according to embodiments of the present disclosure, on which a computer program is stored. The computer program is executed by a processor to implement steps of the above-mentioned photographing method.

BRIEF DESCRIPTION OF THE DRAWINGS

In order to explain technical solutions of embodiments of the present disclosure more clearly, the drawings used in the description of the embodiments of the present disclosure will be briefly illustrated below. Obviously, the drawings in the following description are only some embodiments of the present disclosure. For those of ordinary skill in the art, other drawings can be obtained based on these drawings without paying creative efforts.

DETAILED DESCRIPTION

The technical solutions in embodiments of the present disclosure will be clearly and completely described below with reference to the accompanying drawings in the embodiments of the present disclosure. Obviously, the described embodiments are part of the embodiments of the present disclosure rather than all of the embodiments. Based on the embodiments in the present disclosure, all other embodiments obtained by a person of ordinary skill in the art without creative efforts fall within the protection scope of the present disclosure.

Figure 1:
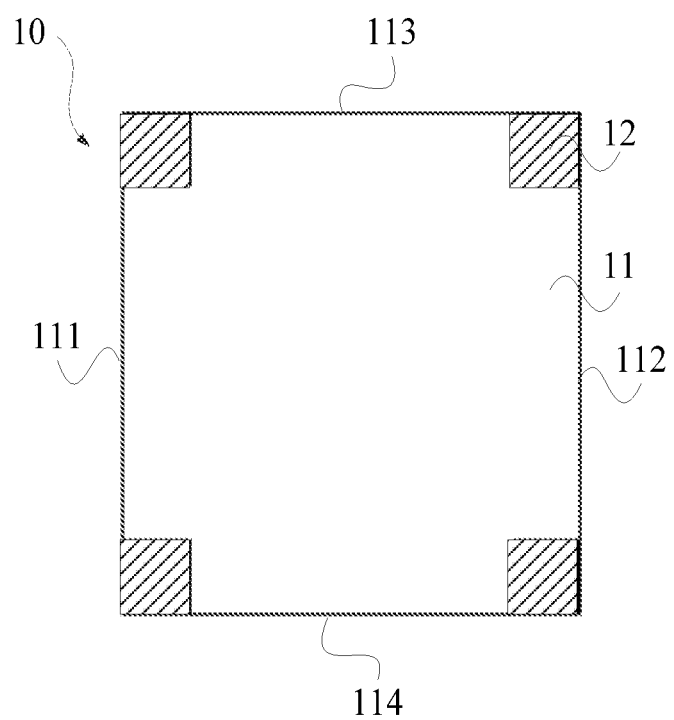
FIG. 1 is a schematic structural diagram of a photosensitive chip according to an embodiment of the present disclosure.

Reference is made to FIG. 1, which is a schematic structural diagram of a photosensitive chip according to an embodiment of the present disclosure.

The embodiment of the present disclosure provides a photosensitive chip 10, which is applied to a mobile terminal having a photographing function, such as a mobile phone, a tablet computer, and the like.

In an embodiment of the present disclosure, the photosensitive chip 10 may include an image sensing portion 11 and ambient light sensing portions 12, the image sensing portion 11 and the ambient light sensing portions 12 are spliced to form a preset pattern, and the preset pattern has a quadrangular structure.

In the embodiment of the present disclosure, the photosensitive chip 10 includes an image sensing portion 11 and ambient light sensing portions 12, which are spliced. The image sensing portion 11 is configured to implement camera shooting and imaging, and the ambient light sensing portion 12 is configured to sense ambient light conditions. The image sensing portion 11 and the ambient light sensing portion 12 are spliced to a photosensitive chip 10. Since the image sensing portion 11 and the ambient light sensing portion 12 are arranged in a spliced manner, the image sensing portion 11 and the ambient light sensing portion 12 may not lose their own sensing areas, thereby not mutually affecting respective photosensitive effects. In addition, in an embodiment, the preset pattern spliced by the image sensing portion 11 and the ambient light sensing portion 12 may be set according to actual use requirements. In an embodiment, the preset pattern may be of a quadrangular structure such as a rectangle or a square.

The working principle of the photosensitive chip 10 provided in the embodiments of the present disclosure is that the photosensitive chip 10 is disposed in a position in the mobile terminal corresponding to the light-transmitting hole, and the photosensitive chip 10 is located in a light projection area formed by incident light transmitting through the light-transmitting hole, so that the photosensitive chip 10 can receive the incident light and perform photosensitive processing, where a camera lens is disposed on the light-transmitting hole. In this way, since the image sensing portion 11 and the ambient light sensing portion 12 are spliced to a photosensitive chip 10, the image sensing portion 11 and the ambient light sensing portion 12 only need to receive and sense incident light through the same light-transmitting hole, thereby reducing the number of light-transmitting holes on a mobile terminal and ensuring a good appearance effect of the mobile terminal.

In the embodiments of the present disclosure, the image sensing portion 11 and the ambient light sensing portion 12 are spliced to a photosensitive chip 10, which can ensure that a sensing area of the image sensing portion 11 and a sensing area of the ambient light sensing portion 12 do not affect each other, thereby ensuring the photosensitive effects of both the two portions. Moreover, the number of light-transmitting holes required for the image sensing portion 11 and the ambient light sensing portion 12 to receive and sense incident light can be decreased.

In a preferred embodiment of the present disclosure, one ambient light sensing portion 12 is provided at each of the four corners of the preset pattern.

In an embodiment of the present disclosure, the photosensitive chip 10 includes one image sensing portion 11 and four ambient light sensing portions 12, the image sensing portion 11 and the ambient light sensing portions 12 are spliced to form a quadrangular structure, and the four ambient light sensing portions 12 are distributed at four corners of a preset pattern of a quadrangular structure. In this way, if the photosensitive chip 10 is arranged on the mobile terminal, the image sensing portion 11 can be located at the middle portion of the light projection area of the light-transmitting hole, which ensures a good imaging effect of the image sensing portion 11 when the mobile terminal performs image shooting. In addition, four ambient light sensing portions 12 are provided, which can better detect the light intensity of the ambient environment, that is, better sense the ambient light conditions.

In a preferred embodiment of the present disclosure, each ambient light sensing portion 12 is constructed as a quadrangular structure. In this embodiment, the ambient light sensing portions 12 of a quadrangular structure are disposed at four corner positions of the preset pattern of the quadrangular structure, and the image sensing portion 11 is formed into a cross-shaped structure, so that the photosensitive effect of the photosensitive chip cannot be affected, while ensuring the photosensitive effect of the ambient light sensing portion 12.

In an embodiment of the present disclosure, in the preset pattern of the quadrangular structure, the image sensing portion 11 has a first width respectively at a first edge 111 and a second edge 112 of the preset pattern that are opposite to each other, and has a second width respectively at a third edge 113 and a fourth edge 114 of the preset pattern that are opposite to each other. That is, in this embodiment, a width of the image sensing portion 11 at the first edge 111 is the same as a width of the image sensing portion 11 at the second edge 112 of the preset pattern, and a width of the image sensing portion 11 at the third edge 113 is the same as a width of the image sensing portion 11 at the fourth edge 114 of the preset pattern.

Preferably, in an embodiment, a ratio of a distance between the first edge 111 and the second edge 112 to the first width is 4:3. In this embodiment, a length-to-width ratio of the largest quadrangular sensing area formed by the first edge 111 and the second edge 112 can be ensured to be 4:3, so as to adapt to a screen display ratio of the mobile terminal (the screen display ratio of the mobile terminal being 4:3). In specific usage, in the image sensing portion 11, the largest quadrilateral sensing area formed by the first edge 111 and the second edge 112 can receive and sense incident light separately and perform photosensitive processing such as photoelectric conversion and analog-digital conversion.

Preferably, in an embodiment, a ratio of a distance between the third edge 113 and the fourth edge 114 to the second width is 4:3. In this embodiment, a length-to-width ratio of the largest quadrangular sensing area formed by the third edge 113 and the fourth edge 114 can be ensured to be 4:3, so as to adapt to the screen display ratio of the mobile terminal. In specific usage, in the image sensing portion 11, the largest quadrilateral sensing area formed by the third edge 113 and the fourth edge 114 can receive and sense incident light separately and perform photosensitive processing such as photoelectric conversion and analog-digital conversion.

In an example, the photosensitive chip 10 includes one image sensing portion 11 and four ambient light sensing portions 12, each of the ambient light sensing portions 12 is formed in a square structure, and the areas of the four ambient sensing portions are equal; and the one image sensing portion 11 and the four ambient light sensing portions 12 are spliced into a preset pattern of a square structure. The four ambient light sensing portions 12 are respectively disposed at the four corner positions of the square structure, and in this case, the image sensing portion 11 is formed as a cross-shaped structure. The length-to-width ratio of the largest quadrilateral sensing area formed by the first edge 111 and the second edge 112 of the image sensing portion 11 that are opposite to each other on the preset pattern is 4:3, and the length-to-width ratio of the largest quadrilateral sensing area formed by the third edge 113 and the fourth edge 114 of the image sensing portion 11 that are opposite to each other on the preset pattern is 4:3.

In the photosensitive chip provided in the embodiments of the present disclosure, the image sensing portion and the ambient light sensing portion are spliced as one photosensitive chip, which can ensure that the respective sensing areas of the image sensing portion and the ambient light sensing portion do not affect each other, and ensure the photosensitive effects of the two portions. Moreover, the number of light-transmitting holes required for the image sensing portion and the ambient light sensing portion to receive and sense incident light can be reduced.

Figure 2:
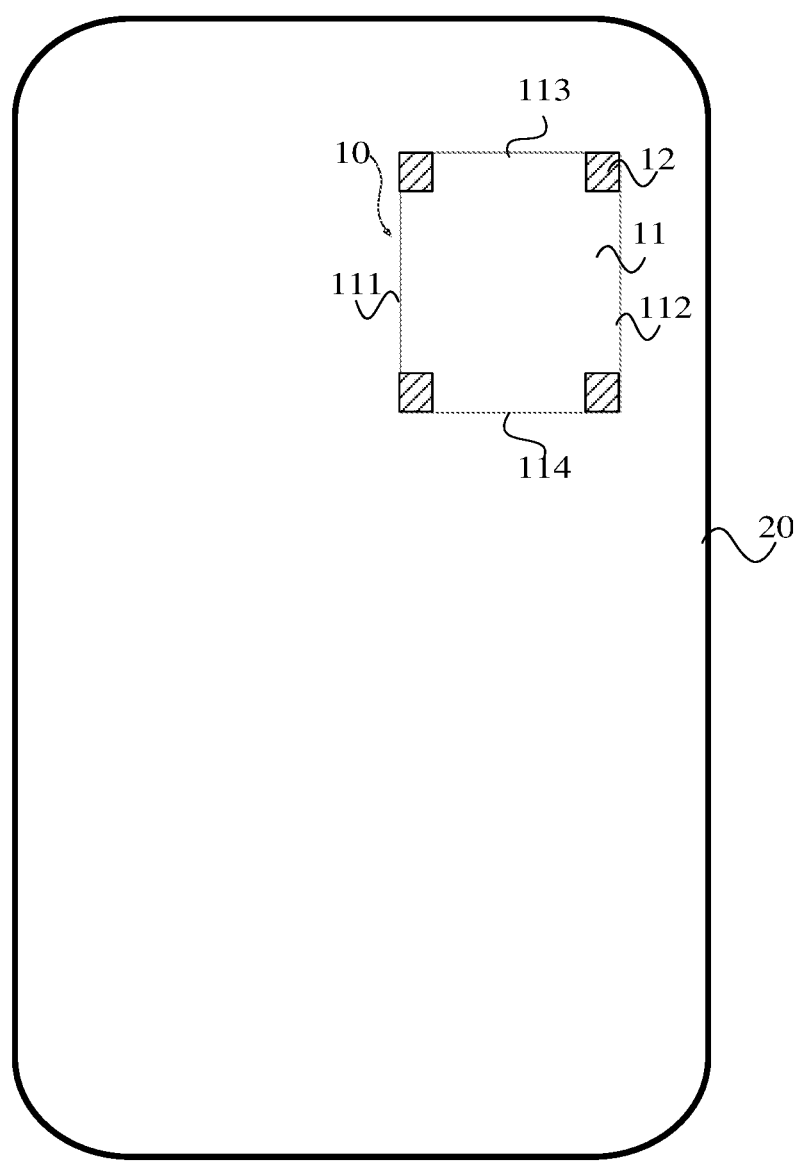
FIG. 2 is a schematic structural diagram of a mobile terminal according to an embodiment of the present disclosure.

Referring to FIG. 2, an embodiment of the present disclosure provides a mobile terminal 20, which has a photographing function. The mobile terminal 20 may include the above-mentioned photosensitive chip 10. The mobile terminal 20 may further include a housing and a light-transmitting hole arranged on the housing for transmitting incident light, where a light projection area is formed when the incident light transmits to the housing.

The photosensitive chip 10 is disposed in the light projection area and is configured to receive the incident light and perform corresponding photosensitive processing.

In an embodiment of the present disclosure, the photosensitive chip 10 is disposed facing the light-transmitting hole in the mobile terminal, and the photosensitive chip 10 is located in the light projection area formed by the light-transmitting hole. The image sensing portion 11 and the ambient light sensing portion 12 of the photosensitive chip 10 can receive corresponding incident light according to demands, and perform corresponding photosensitive processing such as photoelectric conversion, to achieve a corresponding function. That is, when the ambient light sensing portion 12 of the photosensitive chip 10 is used, the ambient light sensing portion 12 can receive corresponding incident light to realize the light intensity detection of the surrounding environment of the mobile terminal; and when the image sensing portion 11 of the photosensitive chip 10 is used, the image sensing portion 11 can receive corresponding incident light for imaging processing, and acquire the captured image. In the embodiments of the present disclosure, the image sensing portion 11 and the ambient light sensing portion 12 are spliced to one photosensitive chip 10, and the photosensitive chip 10 is disposed in the light projection area of the light-transmitting hole. Therefore, the image sensing portion 11 and the ambient light sensing portion 12 only requires a same light-transmitting hole to receive and sense incident light, thereby reducing the number of light-transmitting holes on a mobile terminal 20 and ensuring the appearance effect of the mobile terminal 20. In an embodiment of the present disclosure, a camera lens is disposed on the light-transmitting hole.

In an embodiment of the present disclosure, in order to ensure the imaging effect of the image sensing portion 11 when the mobile terminal 20 performs image capturing, the image sensing portion 11 of the photosensitive chip 10 is disposed in the middle portion of the light projection area.

In an embodiment of the present disclosure, when the preset pattern is of a quadrangular structure, a first edge 111 and a second edge 112 of the image sensing portion 11 in the preset pattern are parallel to a direction of a long edge of the mobile terminal 20, and a third edge 113 and a fourth edge 114 of the image sensing portion 11 in the preset pattern are parallel to a direction of a short edge of the mobile terminal 20, where the first edge 111 and the second edge 112 are opposite to each other, and the third edge 113 and the fourth edge 114 are opposite to each other. In this way, a good imaging effect of the image sensing portion 11 in image capturing can be ensured.

In specific use, the image sensing portion 11 may perform photosensitive processing through a quadrilateral sensing area formed by the opposite first edge 111 and second edge 112, or may perform photosensitive processing through a quadrilateral sensing area formed by the opposite third edge 113 and the fourth edge 114. Preferably, in an embodiment of the present disclosure, each of the first edge 111 and the second edge 112 has a first width, and a ratio of a distance between the first edge 111 and the second edge 112 to the first width is 4:3; and the third edge 113 and the fourth edge 114 respectively have a second width, and a ratio of a distance between the third edge 113 and the fourth edge 114 to the second width is 4:3. Therefore, the quadrilateral sensing area formed by the opposite first edge 111 and second edge 112, and the quadrilateral sensing area formed by the opposite third edge 113 and fourth edge 114 can be respectively adapted to the screen display ratio of the mobile terminal 20.

The mobile terminal provided by the embodiments of the present disclosure can receive incident light through the same light-transmitting hole for the photosensitive processing by the image sensing portion and the ambient light sensing portion in the photosensitive chip, so as to correspondingly realize functions of the image sensing portion and the ambient light sensing portion, which can reduce the number of light-transmitting openings provided on the mobile terminal, ensure the appearance of the mobile terminal, and ensure the reliability and stability of usage and aesthetics of the mobile terminal.

Figure 3:
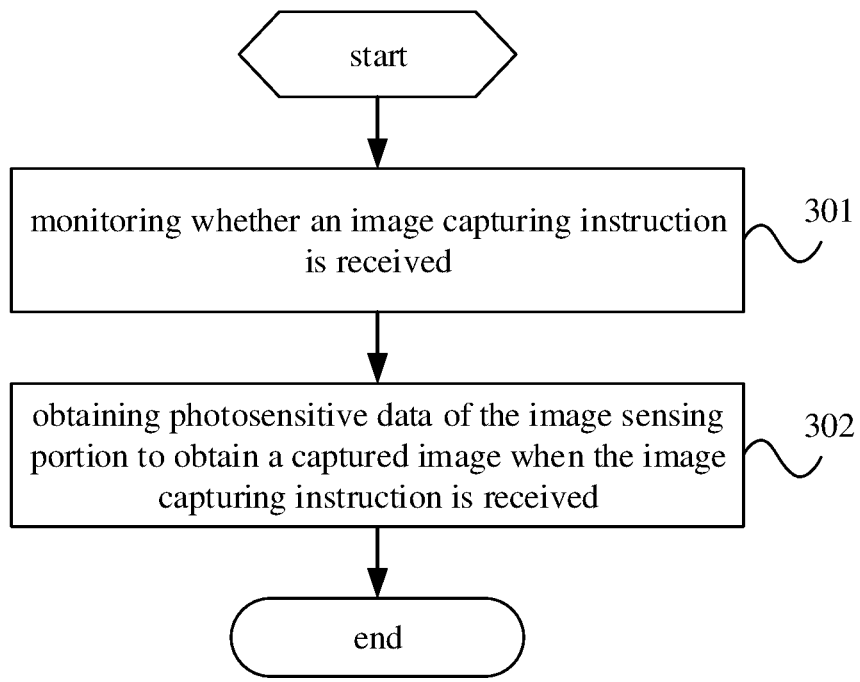
FIG. 3 is a schematic flowchart of a photographing method according to an embodiment of the present disclosure.

Reference is made to FIG. 3, which is a schematic flowchart of a photographing method according to an embodiment of the present disclosure. The photographing method is further provided according to the embodiment of the present disclosure, which is applied to the above mobile terminal. The photographing method may include the following steps:

step 301: monitoring whether an image capturing instruction is received; and step 302: obtaining photosensitive data of the image sensing portion to obtain a captured image when the image capturing instruction is received.

In this step, based on the monitoring of the image capturing instruction in step 301, in a case that the image capturing instruction is received, it means that the image sensing portion in a photosensitive chip needs to be used for image capturing. In this case, incident light is received by the image sensing portion, and photosensitive data of the image-sensing portion is obtained and subjected to photosensitive processing such as photoelectric conversion, digital-to-analog conversion, and the like to obtain a currently captured image. During the photographing process, the ambient light sensing portion in the photosensitive chip can receive the corresponding incident light to realize the light intensity detection of the surrounding environment of the mobile terminal.

In an embodiment of the present disclosure, in step 302, the obtaining the photosensitive data of the image sensing portion to obtain the captured image when the image capturing instruction is received includes:

determining an imaging state when capturing a current image as a horizontal imaging state, in a case that the received image capturing instruction is a horizontal capturing instruction;

determining the imaging state when capturing the current image as a vertical imaging state, in a case that the received image capturing instruction is a vertical capturing instruction; and obtaining photosensitive data in a preset area of the image sensing portion to obtain the captured image, where the preset area is determined according to a predetermined relationship between the imaging state and a sensing area of the image sensing portion, and the imaging state includes the horizontal imaging state and the vertical imaging state.

In an embodiment, when a user needs to photograph, an image capturing instruction is triggered, and the mobile terminal monitors a corresponding image capturing instruction, which is a horizontal capturing instruction or a vertical capturing instruction, determines a corresponding imaging state, which is a horizontal imaging state or a vertical imaging state, activates the preset area of the image sensing portion based on the determined imaging state when the current image is captured, receives incident light by using the preset area to obtain corresponding photosensitive data, and performs photosensitive processing to obtain the captured image. In the embodiments of the present disclosure, the image sensing portion may be provided with at least two different sensing areas, thus, according to different imaging states, corresponding sensing areas are activated for performing photosensitive processing on the incident light to obtain corresponding captured images, which can meet various photographing requirements.

Specifically, in an embodiment of the present disclosure, the sensing area of the image sensing portion may include the largest quadrilateral sensing area formed by a first edge and a second edge of the image sensing portion that are opposite to each other in the preset pattern, and the largest quadrilateral sensing area formed by a third edge and a fourth edge of the image sensing portion that are opposite to each other in the preset pattern, where the first edge and the second edge are parallel to a direction of a long edge of the mobile terminal, and the third edge and the fourth edge are parallel to a direction of a short edge of the mobile terminal.

In addition, each of the first edge 111 and the second edge 112 has a first width, and a ratio of a distance between the first edge 111 and the second edge 112 to the first width is 4:3; and each of the third edge 113 and the fourth edge 114 has a second width, and a ratio of a distance between the third edge 113 and the fourth edge 114 to the second width is 4:3.

In an embodiment of the present disclosure, in a case that the imaging state when the current image is captured is a vertical imaging state, it is determined that the preset area is rectangular, and a direction of a long side of the preset area is parallel to the direction of the long edge of the mobile terminal, and a direction of a short side of the preset area is parallel to the direction of the short edge of the mobile terminal. That is to say, in this case, the preset area is the quadrilateral sensing area formed by the opposite third edge and fourth edge of the image sensing portion in the preset pattern. In this embodiment, the vertical imaging state is an imaging state in which a long-side direction imaged by the photosensitive data is parallel to the direction of the long edge of the mobile terminal, and the imaged short-side direction is parallel to the direction of the short edge of the mobile terminal. In this embodiment, in the vertical imaging state, photosensitive processing is performed on incident light in the preset area formed by the opposite third edge and fourth edge of the image sensing portion in the preset pattern, so as to obtain a needed captured image. In this embodiment, when the imaging state is the vertical imaging state, the captured image obtained by using the corresponding preset area is the same as a captured image obtained in the same photographing mode in the related technology.

In an embodiment of the present disclosure, in a case that the imaging state when the current image is captured is a horizontal imaging state, it is determined that the preset area is rectangular, and a direction of a long side of the preset area is parallel to the direction of the short edge of the mobile terminal, and a direction of a short side of the preset area is parallel to the direction of the long edge of the mobile terminal. That is to say, in this case, the preset area is the quadrilateral sensing area formed in the opposite first edge and second edge of the image sensing portion in the preset pattern. In this embodiment, the horizontal imaging state is an imaging state in which a direction of a long side imaged by the photosensitive data is perpendicular to the direction of the long edge of the mobile terminal, and the short-side direction as imaged is perpendicular to the direction of the short edge of the mobile terminal. In this embodiment, in horizontal imaging, photosensitive processing is performed on incident light by the preset area formed by the opposite first edge and second edge of the image sensing portion in the preset pattern, so as to obtain a needed captured image. In this case, when a screen of the mobile terminal is in a horizontal state, a captured image of a landscape-mode photographing effect in the related technology can be obtained, and when the screen of the mobile terminal is in a vertical state, a captured image of a portrait-mode photographing effect in the related technology can be obtained. In this embodiment, when the imaging state is the horizontal imaging state, the captured image obtained by using the corresponding preset area is different from a captured image obtained in the same photographing mode in the related technology. In such manner, when the horizontal photographing instruction is monitored, a landscape-mode photographing requirement of a user can be satisfied when a screen of the mobile terminal is in a vertical state, and a portrait-mode photographing requirement of the user can be satisfied when the screen of the mobile terminal is in a horizontal state.

In the photographing method provided by the embodiments of the present disclosure, the image sensing portion of the photosensitive chip can be activated to realize photographing function of the photosensitive chip, based on the monitoring of the image capturing instruction and by utilizing the special structure of the photosensitive chip of the mobile terminal, thereby satisfying photographing demands of users. At the same time, in the process of photographing, the ambient light sensing portion of the photosensitive chip can detect the light intensity of the ambient environment of the mobile terminal.

Based on the above method, embodiments of the present disclosure provide a mobile terminal for implementing the above method.

Figure 4:
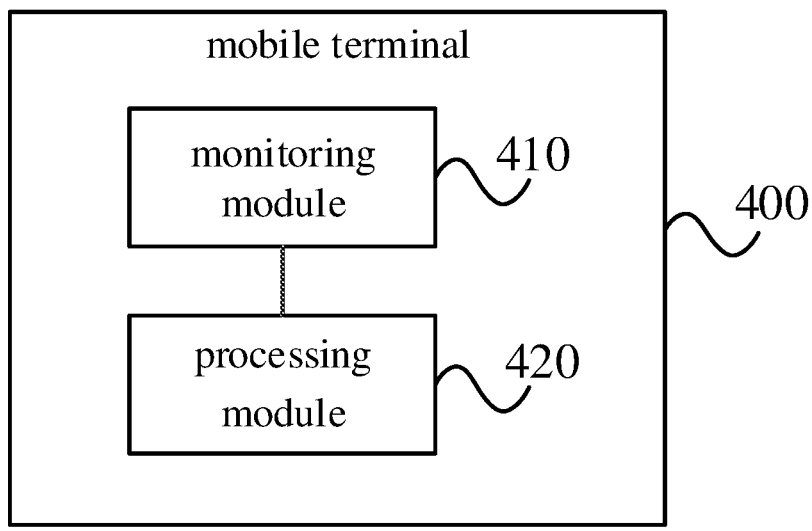
FIG. 4 is a schematic diagram of a virtual structure of a mobile terminal according to an embodiment of the present disclosure.

Reference is made to FIG. 4, which is a schematic diagram of a virtual structure of a mobile terminal according to an embodiment of the present disclosure. An embodiment of the present disclosure provides a mobile terminal 400. The mobile terminal 400 may include a monitoring module 410 and a processing module 420.

The monitoring module 410 is configured to monitor whether an image capturing instruction is received.

The processing module 420 is configured to obtain photosensitive data of an image sensing portion to obtain a captured image, when the image capturing instruction is received.

In an embodiment of the present disclosure, the processing module 420 may include a first determination unit, a second determination unit, and a processing unit.

The first determination unit is configured to determine an imaging state for capturing a current image as a horizontal imaging state, in a case that the received image capturing instruction is a horizontal capturing instruction.

The second determination unit is configured to determine the imaging state for capturing the current image as a vertical imaging state, in a case that the received image capturing instruction is a vertical capturing instruction.

The processing unit is configured to obtain photosensitive data in a preset area of the image sensing portion to obtain the captured image, where the preset area is determined according to a predetermined relationship between the horizontal imaging state and the vertical imaging state and a sensing area of the image sensing portion.

In an embodiment of the present disclosure in a case that the imaging state when capturing the current image is the vertical imaging state, it is determined that the preset area is a rectangle, a direction of a long side of the preset area is parallel to a direction of a long edge of the mobile terminal, and a direction of a short side of the preset area is parallel to a direction of a short edge of the mobile terminal.

In an embodiment of the present disclosure, in a case that the imaging state when capturing the current image is the horizontal imaging state, it is determined that the preset area is a rectangle, a direction of a long side of the preset area is parallel to a direction of a short edge of the mobile terminal, and a direction of a short side of the preset area is parallel to a direction of a long edge of the mobile terminal.

The mobile terminal 400 provided by the embodiments of the present disclosure can implement various processes implemented by the mobile terminal in the method embodiments in FIG. 3, and details are not described herein again to avoid repetition.

The mobile terminal provided by the embodiments of the present disclosure can utilize the special structure of the photosensitive chip of the mobile terminal to activate the image sensing portion of the photosensitive chip to realize photographing function of the photosensitive chip based on the monitoring of the image capturing instruction, which can meet the photographing demands of users. At the same time, in the process of photographing, the ambient light sensing portion of the photosensitive chip can detect the light intensity of the ambient environment of the mobile terminal.

In addition, embodiments of the present disclosure provide a mobile terminal including a processor, a memory, and a computer program that is stored on the memory and is executable on the processor. The processor is configured to execute the computer program to implement steps of the foregoing photographing method.

Those skilled in the art may well appreciate that various portions (such as the image sensing portion and the ambient light sensing portion), modules, units and algorithm steps of various examples described in conjunction with the embodiments according to the present disclosure can be implemented in the form of electronic hardware or a combination of computer software and electronic hardware. Whether these functions are performed in hardware or software depends on the specific application and design constraints of the solution. Those skilled in the art can use different methods to implement the described functions for each particular application, but such implementation should not be considered as going beyond the scope of the present disclosure.

Those skilled in the art can clearly understand that for convenience and brevity of description, reference can be made to the corresponding processes in the foregoing method embodiments for specific operating processes of the system, the device and the units described above, which is not described herein redundantly.

It should be understood that in the embodiments according to the present application, the disclosed apparatus and method may be implemented in other manners. For example, the apparatus embodiments described above are merely illustrative. For example, the division of the portions, the modules and the units is only a logical function division, and in practical implementation, there may be another division manner. For example, multiple units or components may be combined or integrated into another system, or some features can be ignored or not implemented. In addition, the mutual coupling or direct coupling or communication connection shown or discussed may be implemented with some interfaces, and indirect coupling or communication connection between apparatuses or units may be electrical, mechanical or in other forms.

The portions, modules and units described as separate components may or may not be physically separated, and the components shown as units may or may not be physical units, that is, they may be located in one place or distributed to multiple network units. Some or all of the units may be selected according to practical needs to achieve the objective of the technical solutions of the embodiments.

In addition, functional portions, modules and units in various embodiments of the present disclosure may be integrated into one processing unit, or each unit may exist physically separately, or two or more units may be integrated into one unit.

In a case that the functions are implemented in the form of a software functional unit which is sold or used as a standalone product, the product may be stored in a computer readable storage medium. Based on such understanding, the essence or the portion of the technical solutions of the present disclosure that contributes to the prior art may be embodied in the form of a software product. The computer software product is stored in a storage medium, which includes instructions that cause a computer device (which may be a personal computer, a server or a network device) to perform all or part of the steps of the methods according to the embodiments of the present disclosure. The foregoing storage medium may include any storage medium that can store program codes, such as a USB flash drive, a mobile hard disk, an ROM, an RAM, a magnetic disk, or an optical disk.

A person of ordinary skill in the art can understand that all or part of the processes in the method of the above embodiments can be completed by a computer program controlling relevant hardware. The program may be stored a computer-readable storage medium, and the program is executed to perform processes of the method in the above embodiments. The storage medium may be a magnetic disk, an optical disk, a read-only memory or a random access memory, etc.

It should be understood that in the description of the specification, the terms "an embodiment", "one embodiment" or "some embodiments" mean that specific features, structures or characteristics related to the embodiments are included in at least one embodiment or example. Therefore, "in an embodiment", "in one embodiment", or "in some embodiments" appearing throughout the specification does not necessarily refer to the same embodiment. In addition, elements, structures or features described in one drawing or one embodiment of the present disclosure may be combined with elements, structures or features shown in one or more other drawings or embodiments in any suitable manner.

In addition, in one or more embodiments in the present disclosure, such term as "include" or "comprise" is used to indicate the presence of listed features or components, but does not exclude the presence of one or more other listed features or one or more other components.

In the present disclosure, unless otherwise clearly specified and defined, such terms as "installed", "connected", "interconnected", "fixed" and "disposed" should be understood in a broad sense, for example, it may be fixed connection or detachable connection, or in an integrated form; it may be mechanical connection or electrical connection; it may be directly connected or indirectly connected through an intermediate medium, or may be communication between two components or interaction between two components. Those of ordinary skill in the art can understand the specific meanings of the above terms in the present disclosure according to specific situations.

In addition, in the embodiments of the present disclosure, relational terms such as first and second are only used to distinguish one entity or operation from another entity or operation, and do not necessarily require or imply any actual relationship or order between these entities or operations.

The foregoing are preferred embodiments of the present disclosure. It should be noted that numerous improvements and modifications may be made by those skilled in the art without departing from the principle of the present disclosure, and these improvements and modifications shall also fall within the protection scope of the present disclosure.

What is claimed is:

1. A photosensitive chip, comprising an image sensing portion and ambient light sensing portions, wherein the image sensing portion and the ambient light sensing portions are spliced to form a preset pattern, and the preset pattern is of a quadrangular structure;

each of four corners of the preset pattern is provided with one of the ambient light sensing portions;

the image sensing portion has a first width respectively at a first edge and a second edge of the preset pattern, and has a second width respectively at a third edge and a fourth edge of the preset pattern, the first edge and the second edge are opposite to each other, and the third edge and the fourth edge are opposite to each other;

the photosensitive chip is configured to:

obtain photosensitive data in a first preset area of the image sensing portion to obtain a captured image in a case that a horizontal capturing instruction is received by a terminal having the photosensitive chip, wherein the first preset area is a rectangle sensing region formed by the first edge and the second edge, and a ratio of a distance between the first edge and the second edge to the first width is 4:3; and obtain photosensitive data in a second preset area of the image sensing portion to obtain the captured image in a case that a vertical capturing instruction is received by the terminal, wherein the second preset area is a rectangle sensing region formed by the third edge and the fourth edge, and a ratio of a distance between the third edge and the fourth edge to the second width is 4:3; and wherein a superimposition of the first preset area and the second preset area occupies all the active sensing region of the image sensing portion.

2. The photosensitive chip according to claim 1, wherein each of the ambient light sensing portions is constructed as a quadrangular structure.

3. A mobile terminal, comprising a photosensitive chip, wherein the photosensitive chip comprises an image sensing portion and ambient light sensing portions, the image sensing portion and the ambient light sensing portions are spliced to form a preset pattern, and the preset pattern is of a quadrangular structure, each of four corners of the preset pattern is provided with one of the ambient light sensing portions;

the image sensing portion has a first width respectively at a first edge and a second edge of the preset pattern, and has a second width respectively at a third edge and a fourth edge of the preset pattern, the first edge and the second edge are opposite to each other, and the third edge and the fourth edge are opposite to each other;

the photosensitive chip is configured to:

obtain photosensitive data in a first preset area of the image sensing portion to obtain a first captured image in a case that a horizontal capturing instruction is received by a terminal having the photosensitive chip, wherein the first preset area is a rectangle sensing region formed by the first edge and the second edge, and a ratio of a distance between the first edge and the second edge to the first width is 4:3; and obtain photosensitive data in a second preset area of the image sensing portion to obtain a second captured image in a case that a vertical capturing instruction is received by the terminal, wherein the second preset area is a rectangle sensing region formed by the third edge and the fourth edge, and a ratio of a distance between the third edge and the fourth edge to the second width is 4:3;

wherein a superimposition of the first preset area and the second preset area occupies all the active sensing region of the image sensing portion;

wherein the mobile terminal further comprises a housing, and the housing is provided with a light-transmitting hole used to transmit incident light to form a light projection area; and the photosensitive chip is disposed in the light projection area, and is configured to receive the incident light and perform corresponding photosensitive processing.

4. The mobile terminal according to claim 3, wherein the image sensing portion of the photosensitive chip is disposed at a middle portion of the light projection area.

5. The mobile terminal according to claim 3, wherein in a case that the preset pattern is of a quadrangular structure, the first edge and the second edge of the image sensing portion in the preset pattern are parallel to a direction of a long edge of the mobile terminal, the third edge and the fourth edge of the image sensing portion in the preset pattern are parallel to a direction of a short edge of the mobile terminal.

6. The mobile terminal according to claim 3, wherein each of four corners of the preset pattern is provided with one of the ambient light sensing portions.

7. The mobile terminal according to claim 3, wherein each of the ambient light sensing portions is constructed as a quadrangular structure.

8. A photographing method, applied to the mobile terminal according to claim 3, wherein the photographing method comprises:
monitoring whether an image capturing instruction is received; and
obtaining photosensitive data of the image sensing portion to obtain a captured image when the image capturing instruction is received.

9. The photographing method according to claim 8, wherein the obtaining the photosensitive data of the image sensing portion to obtain the captured image when the image capturing instruction is received comprises:
determining an imaging state when capturing a current image as a horizontal imaging state, in a case that the received image capturing instruction is a horizontal capturing instruction;
determining the imaging state when capturing the current image as a vertical imaging state, in a case that the received image capturing instruction is a vertical capturing instruction; and
obtaining photosensitive data in a preset area of the image sensing portion to obtain the captured image, wherein the preset area is determined according to a predetermined relationship between the imaging state and a sensing area of the image sensing portion, and the imaging state comprises the horizontal imaging state and the vertical imaging state.

10. The photographing method according to claim 9, further comprising:
determining the preset area as a rectangle in a case that the imaging state when capturing the current image is the vertical imaging state, wherein a direction of a long side of the preset area is parallel to a direction of a long edge of the mobile terminal, and a direction of a short side of the preset area is parallel to a direction of a short edge of the mobile terminal.

11. The photographing method according to claim 9, further comprising:
determining the preset area as a rectangle in a case that the imaging state when capturing the current image is the horizontal imaging state, wherein a direction of a long side of the preset area is parallel to a direction of a short edge of the mobile terminal, and a direction of a short side of the preset area is parallel to a direction of a long edge of the mobile terminal.

12. A mobile terminal, comprising:
the photosensitive chip according to claim 1; and
a processor, a memory, and a computer program that is stored on the memory and executable on the processor, wherein the processor is configured to execute the computer program to:
monitor whether an image capturing instruction is received; and
obtain photosensitive data of an image sensing portion to obtain a captured image when the image capturing instruction is received.

13. The mobile terminal according to claim 12, wherein the processor is configured to:
determine an imaging state when capturing a current image as a horizontal imaging state, in a case that the received image capturing instruction is a horizontal capturing instruction;
determine the imaging state when capturing the current image as a vertical imaging state, in a case that the received image capturing instruction is a vertical capturing instruction; and
obtain photosensitive data in a preset area of the image sensing portion to obtain the captured image, wherein the preset area is determined according to a predetermined relationship between the imaging state and a sensing area of the image sensing portion, and the imaging state comprises the horizontal imaging state and the vertical imaging state.

14. The mobile terminal according to claim 13, wherein the processor is further configured to:
in a case that the imaging state when capturing the current image is the vertical imaging state, determine that the preset area is a rectangle, wherein a direction of a long side of the preset area is parallel to a direction of a long edge of the mobile terminal, and a direction of a short side of the preset area is parallel to a direction of a short edge of the mobile terminal.

15. The mobile terminal according to claim 13, wherein the processor is further configured to:
in a case that the imaging state when capturing the current image is the horizontal imaging state, determine that the preset area is a rectangle, wherein a direction of a long side of the preset area is parallel to a direction of a short edge of the mobile terminal, and a direction of a short side of the preset area is parallel to a direction of a long edge of the mobile terminal.

16. A non-transitory computer-readable storage medium, wherein a computer program is stored thereon, and the computer program is executed by a processor to implement steps of the photographing method according to claim 8.

* * * * *